United States Patent
Kondo

(10) Patent No.: US 9,761,318 B1
(45) Date of Patent: Sep. 12, 2017

(54) SEMICONDUCTOR MEMORY DEVICE

(71) Applicant: Toshiba Memory Corporation, Tokyo (JP)

(72) Inventor: Shigeo Kondo, Yokkaichi Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/253,520

(22) Filed: Aug. 31, 2016

(30) Foreign Application Priority Data

Mar. 10, 2016 (JP) .................. 2016-047472

(51) Int. Cl.
G11C 16/10 (2006.01)
G11C 16/30 (2006.01)
G11C 16/08 (2006.01)
G11C 16/26 (2006.01)
G11C 16/34 (2006.01)

(52) U.S. Cl.
CPC .............. G11C 16/30 (2013.01); G11C 16/08 (2013.01); G11C 16/26 (2013.01); G11C 16/3436 (2013.01)

(58) Field of Classification Search
CPC ................................ G11C 16/10; G11C 16/26
USPC ........................................ 365/185.23, 185.24
See application file for complete search history.

(56) References Cited

U.S. PATENT DOCUMENTS

| 6,643,188 | B2 | 11/2003 | Tanaka et al. | |
|---|---|---|---|---|
| 7,436,733 | B2 | 10/2008 | Mokhlesi | |
| 7,457,178 | B2 * | 11/2008 | Tu | G11C 11/5628 365/185.18 |
| 7,505,313 | B2 * | 3/2009 | Kang | G11C 11/5628 365/185.02 |
| 7,564,711 | B2 | 7/2009 | Mokhlesi | |
| 7,567,455 | B2 * | 7/2009 | Khaef | G11C 11/5628 365/185.02 |
| 7,719,902 | B2 | 5/2010 | Dong et al. | |
| 7,796,438 | B2 * | 9/2010 | Kim | G11C 16/10 365/185.17 |
| 7,839,687 | B2 | 11/2010 | Dutta et al. | |
| 7,889,566 | B2 * | 2/2011 | Kang | G11C 11/5628 365/185.03 |
| 7,894,273 | B2 | 2/2011 | Li et al. | |
| 8,144,512 | B2 | 3/2012 | Huang et al. | |

(Continued)

FOREIGN PATENT DOCUMENTS

JP 2013-532881 A 8/2013

*Primary Examiner* — Michael Tran
(74) *Attorney, Agent, or Firm* — Patterson & Sheridan, LLP

(57) ABSTRACT

A memory device capable of narrowing the threshold voltage distribution thereof includes word lines, bit lines, memory cells, a word line driver configured to apply voltage to a selected word line, a sense amplifier circuit configured to detect data of the memory cell, and a controller configured to control the word line driver and the sense amplifier. A write sequence includes a write operation in which write voltage is applied to the selected word line by the word line driver, and a verify operation in which, when a threshold voltage of the selected memory cell reaches a reference voltage, writing to the selected memory cell is completed. Based on second data that is written later than the first data to an adjacent memory cell adjacent to the selected memory cell, the controller changes the reference voltage used for completing the writing to the selected memory cell.

16 Claims, 9 Drawing Sheets

(56) References Cited

U.S. PATENT DOCUMENTS

| | | | |
|---|---|---|---|
| 8,208,310 B2 | 6/2012 | Dong et al. | |
| 8,254,168 B2 * | 8/2012 | Suzuki | G11C 11/5628 |
| | | | 365/185.03 |
| 8,310,870 B2 | 11/2012 | Dutta et al. | |
| 8,472,259 B2 * | 6/2013 | Futatsuyama | G11C 11/5628 |
| | | | 365/185.2 |
| 8,472,280 B2 | 6/2013 | Li | |
| 8,565,020 B2 | 10/2013 | Futatsuyama et al. | |
| 8,743,606 B2 | 6/2014 | Dutta et al. | |
| 8,797,800 B1 | 8/2014 | Dong et al. | |
| 8,824,207 B2 * | 9/2014 | Kim | G11C 16/0483 |
| | | | 365/185.12 |
| 8,854,878 B2 * | 10/2014 | Honma | G11C 16/3427 |
| | | | 365/185.02 |
| 8,902,668 B1 | 12/2014 | Dutta et al. | |
| 8,913,432 B2 | 12/2014 | Dong et al. | |
| 9,007,826 B2 | 4/2015 | Fujiu | |
| 9,269,443 B2 * | 2/2016 | Lim | G11C 16/0483 |
| 9,437,286 B2 * | 9/2016 | Kang | G11C 16/10 |
| 9,437,303 B1 * | 9/2016 | Liu | G11C 16/10 |

* cited by examiner

FIG. 5

|  | WL0 | WL1 | WL2 | WL3 | WL4 |
|---|---|---|---|---|---|
| S1 | Erase | Erase | Erase | Erase | Erase |
| S2 | LM | Erase | Erase | Erase | Erase |
| S3 | LM | LM | Erase | Erase | Erase |
| S4 | Foggy | LM | Erase | Erase | Erase |
| S5 | Foggy | LM | LM | Erase | Erase |
| S6 | Foggy | Foggy | LM | Erase | Erase |
| S7 | Fine | Foggy | LM | Erase | Erase |
| S8 | Fine | Foggy | LM | LM | Erase |
| S9 | Fine | Foggy | Foggy | LM | Erase |
| S10 | Fine | Fine | Foggy | LM | Erase |
| S11 | Fine | Fine | Foggy | LM | LM |
| S12 | Fine | Fine | Foggy | Foggy | LM |
| S13 | Fine | Fine | Fine | Foggy | LM |
| S14 | Fine | Fine | Fine | Foggy | LM |
| S15 | Fine | Fine | Fine | Foggy | Foggy |
| S16 | Fine | Fine | Fine | Fine | Foggy |

SEMICONDUCTOR MEMORY DEVICE

CROSS-REFERENCE TO RELATED APPLICATION

This application is based upon and claims the benefit of priority from Japanese Patent Application No. 2016-047472, filed Mar. 10, 2016, the entire contents of which are incorporated herein by reference.

FIELD

Embodiments of the present invention relate to a semiconductor memory device.

BACKGROUND

In a nonvolatile memory such as an NAND type EEPROM (Electrically Erasable Programmable Read-Only Memory), an inter-cell interference effect (proximity interference effect) is increased with the miniaturization of the memory. When an inter-cell interference effect is increased, the threshold voltage of a memory cell may be changed as a result of writing to an adjacent memory cell, thereby, causing the threshold voltage distribution of a memory cell to spread.

Meanwhile, a multi-valued memory cell such as an MLC (Multi Level Cell) has been developed. In the MLC, since the threshold voltage range corresponding to each stored data value is required to be relatively narrow, the threshold voltage distribution of a memory cell needs to be as narrow as possible. However, if the threshold voltage distribution of a memory cell is spread due to an inter-cell interference effect, it becomes difficult to achieve the threshold voltage ranges of the MLC. Therefore, it would be desirable to narrow the threshold voltage distribution of a memory cell while miniaturizing a device.

DESCRIPTION OF THE DRAWINGS

FIG. 5 is a conceptual diagram showing the order in which data are written to word lines WL;

DETAILED DESCRIPTION

According to an embodiment of the present invention, there is provided a semiconductor memory device capable of narrowing the threshold voltage distribution of a memory cell while achieving miniaturization.

In general, according to one embodiment, a semiconductor memory device includes a plurality of word lines, a plurality of bit lines, a plurality of memory cells at intersections of the word lines and the bit lines, a word line driver that applies voltage to a selected word line among the plurality of word lines, a sense amplifier circuit that detects data of at least one of the memory cells, and a controller that controls the word line driver and the sense amplifier. A write sequence for writing first data to a selected memory cell connected to the selected word line includes a write loop that includes a write operation in which write voltage is applied to the selected word line by the word line driver, and a verify operation in which, when a threshold voltage of the selected memory cell reaches a reference voltage, writing to the selected memory cell is completed by the controller. Based on second data that is written later than the first data to an adjacent memory cell adjacent to the selected memory cell, the controller changes the reference voltage used for completing the writing to the selected memory cell.

Embodiments of the present invention will be described below with reference to the accompanying drawings. The embodiments do not limit the present invention.

First Embodiment

Figure 1:
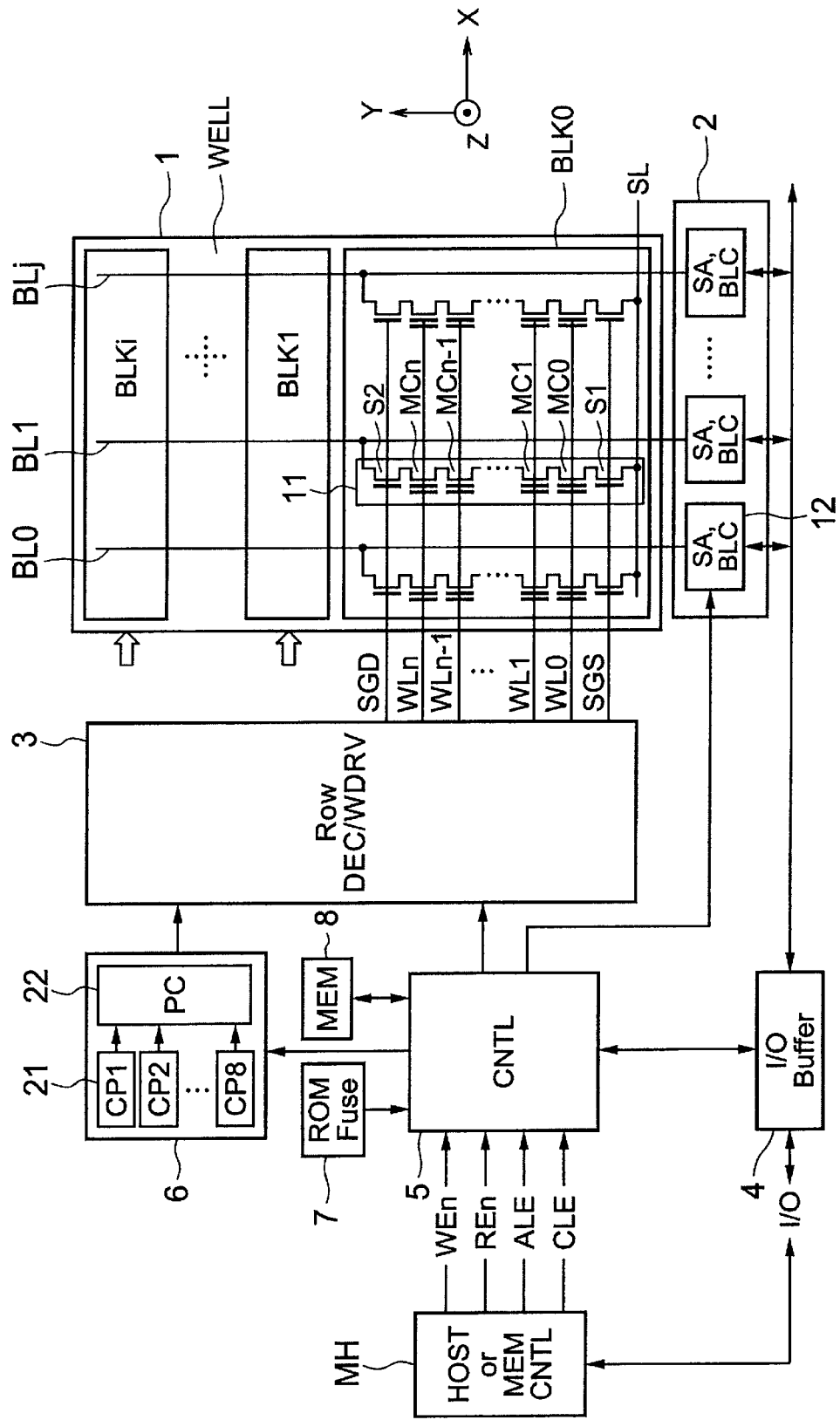
FIG. 1 is a diagram showing an example of a configuration of a nonvolatile semiconductor memory device (hereinafter, simply referred to as a memory) of a first embodiment.

FIG. 1 is a diagram showing an example of a configuration of a nonvolatile semiconductor memory device (hereinafter, simply referred to as a memory) of a first embodiment. A memory according to the embodiment is, for example, a NAND type EEPROM.

The memory according to the embodiment includes a memory cell array 1, a sense amplifier circuit 2, a row decoder 3, an input-output (I/O) buffer 4, a controller 5, a voltage generating circuit 6, a ROM fuse 7 and a data storage circuit 8.

The memory cell array 1 includes a plurality of memory blocks BLK0 to BLKi (i is an integer equal to or higher than 2) that are formed on the same well. Further, each memory block BLK is configured such that a plurality of NAND cell units 11 extending in a Y direction are arranged in an X-direction, as shown in FIG. 1. Furthermore, each of the NAND cell units 11 includes a plurality of memory cells MC0 to MCn (n is an integer equal to or higher than 1, for example, n=63) connected in series, and selection transistors S1 and S2 that are connected to both ends thereof. The memory cells MC are provided so as to correspond to the intersections of the word lines WL and the bit lines BL.

In FIG. 1, word lines WL0 to WLn and selected gate lines SGS and SGD for the memory block BLK0 are shown. The word lines WL0 to WLn are connected to the control gates of the memory cells MC0 to MCn, respectively, and extend in the X direction. Further, the selected gate lines SGS and SGD are connected to the gates of the selection transistors S1 and S2, respectively, and extend in the X direction. Furthermore, the word lines WL 0 to WLn and the selected gate lines SGS and SGD are shared by a plurality of NAND cell units 11 which are adjacent to one another in the X direction.

In addition, the source of each selection transistor S1 in the memory block BLK0 is connected to the same source line SL. Furthermore, the drain of each selection transistor S2 in the memory block BLK0 is connected to the corresponding bit lines BL0 to BLj (j is an integer equal to or higher than 2, for example, 70,000). As shown in FIG. 1, the source line SL extends in the X direction, and the bit lines BL 0 to BLj extend in the Y direction.

The sense amplifier circuit 2 includes a sense amplifier SA and a bit line controller BLC. The sense amplifier SA is a circuit for reading data through the bit lines BL0 to BLj from at least one of the memory cells MC. By comparing the voltage corresponding to data in the memory cell MC with the reference voltage, the sense amplifier SA detects the logic of the data. Depending on an address received from the controller 5, the bit line controller BLC selectively drives one or more bit lines BL among the plurality of bit lines BL. By controlling the voltage of a selected bit line BL, the bit line controller BLC performs write control, verify-read and read operations.

For example, in the verify-read and read operations, the sense amplifier circuit 2 detects data stored in the selected memory cell MC connected to a selected word line WL and the selected bit line BL. The sense amplifier circuit 2 further includes a data latch circuit (not shown) capable of temporarily holding the data detected in the sense amplifier SA.

The row decoder (word line driver) 3 is a circuit for selecting any of word lines and selected gate lines and applying voltage to the word line or the selected gate line.

The I/O buffer 4 is a circuit for passing data between the sense amplifier circuit 2 and an external input-output terminal, and receiving command data and address data from the controller 5.

The controller 5 performs various controls of the memory cell array 1. For example, the controller 5 receives an external control signal such as a write enable signal WEn, a read enable signal REn, an address latch enable signal ALE, a command latch enable signal CLE from a host or a memory controller (MH) provided outside. Then, the controller 5 controls the row decoder (word line driver) 3, the sense amplifier circuit 2, the bit line controller BLC and the like to perform a write operation, a read operation, an erase operation and the like.

The voltage generating circuit 6 includes a plurality of boosting circuits 21 and a pulse generating circuit 22. As a result of receipt of a control signal from the controller 5, the voltage generating circuit 6 switches the number of the boosting circuits 21 that are driving. Further, by controlling the pulse generating circuit 22, the voltage generating circuit 6 adjusts the pulse width and the pulse height of pulse voltage.

The ROM fuse 7 is a storage unit for storing set values of the pulse width and the pulse height of the pulse voltage at a time of writing or erasing. For example, the ROM fuse 7 stores values such as write voltage (program voltage) Vpgm that is applied to a word line during a write operation, a rise width (step-up width) ΔVpgm of the write voltage, the verify level and the like. Note that the write voltage Vpgm, the step-up width ΔVpgm and the verify level may be provided from the outside of the memory.

The data storage circuit 8 is a rewritable nonvolatile storage circuit for storing various data used for the control of the memory cell array 1.

Figure 2:
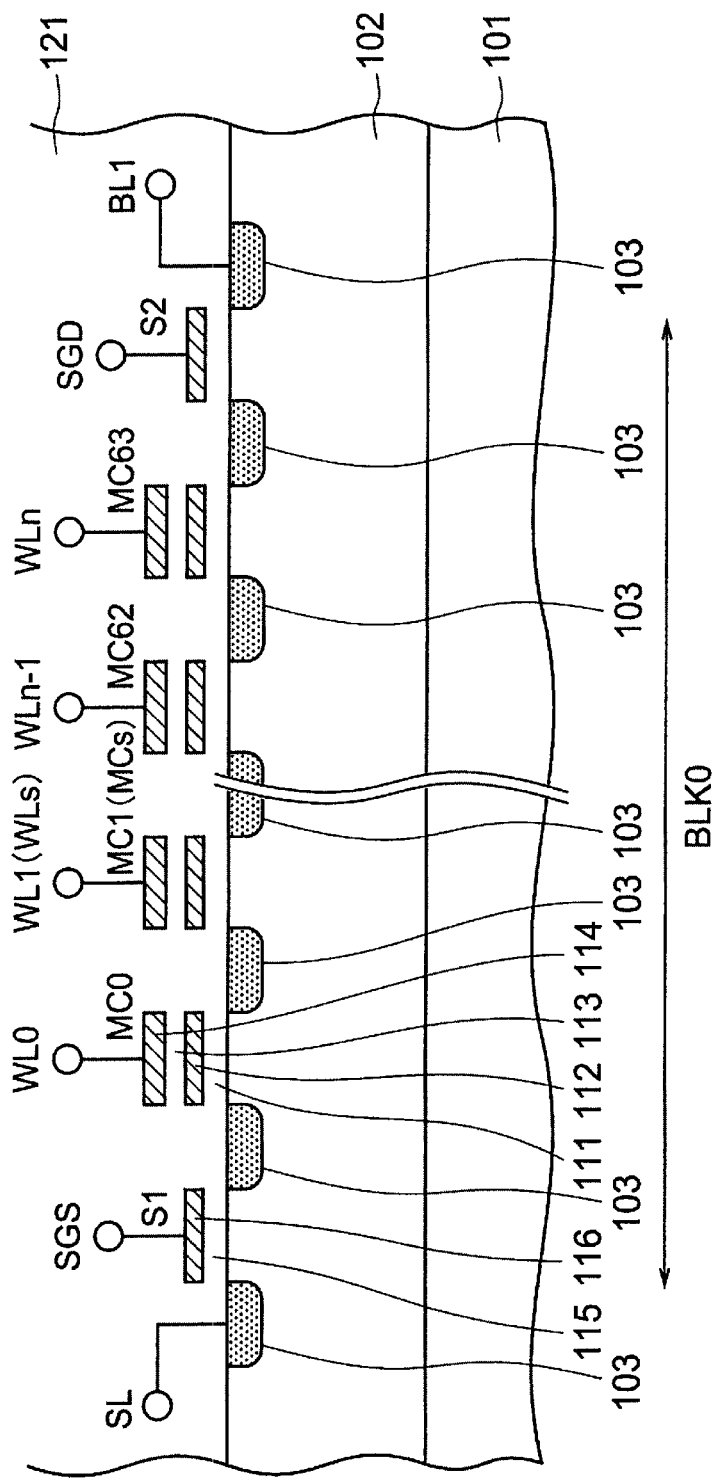
FIG. 2 is a schematic sectional view showing an example of a configuration of a NAND cell unit.

FIG. 2 is a schematic sectional view showing an example of a configuration of a NAND cell unit 11. The NAND cell unit 11 includes a plurality of memory cells MC connected in series, and two selection transistors S1 and S2 that are connected to both ends thereof. The selection transistor S1 on the source side is connected to the source line SL, and the selection transistor S2 on the drain side is connected to the bit line BL, respectively.

The memory cells MC0 to MCn and the selection transistors S1 and S2 are formed on a well 102 in a semiconductor substrate 101, and are connected in series by a diffusion layer 103 in the well 102. These transistors are covered with an interlayer insulating film 121.

Each of the memory cells MC includes a charge storage layer (for example, floating gate) 112 and a control gate 114. The charge storage layer 112 is provided on the semiconductor substrate 101 via a gate insulating film 111. The control gate 114 is formed on the charge storage layer 112 via an inter-gate insulating film 113. Further, each of the selection transistors S1 and S2 include a gate electrode 116 formed on the semiconductor substrate 101 over a gate insulating film 115 therebetween. Note that the charge storage layer 112 may be an insulating film having a charge storage function (for example, a silicon nitride film).

The control gate 114 is connected to any of the word lines WL0 to WLn. The memory cell MC0 at one end of the NAND cell unit 11 is connected to a source line SL via the selection transistor S1. The memory cell MCn at the other end of the NAND cell unit 11 is connected to a bit line BL via the selection transistor S2. Note that the number of word lines WL, bit lines BL and memory cells MC are not particularly limited. In addition, the memory cell MC may be any of an SLC (Single-Level Cell), an MLC (Multi-Level Cell), a TLC (Triple-Level Cell) or a QLC (Quadruple-Level Cell) or higher.

Figure 3:
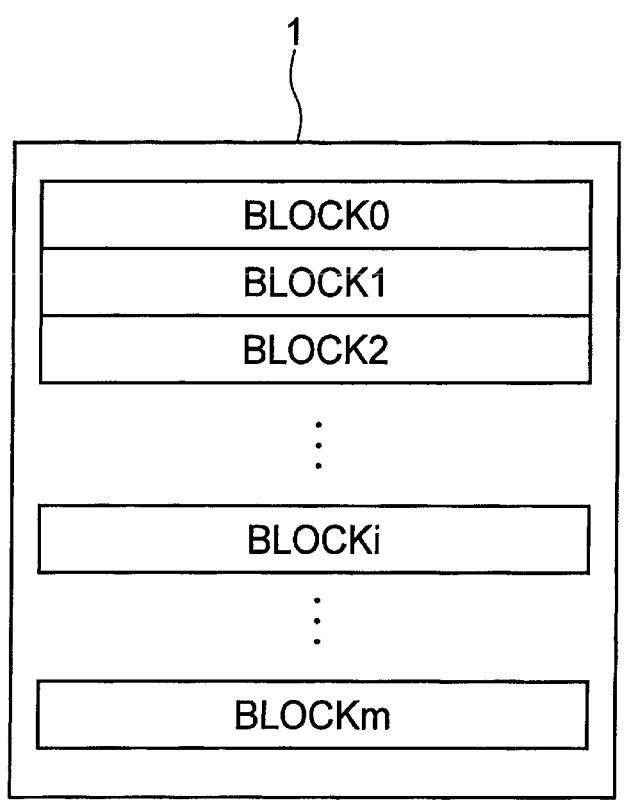
FIG. 3 is a diagram showing the concept of a block, a page and the like in a memory cell array.

FIG. 3 is a diagram showing the concept of a block, a page and the like in the memory cell array 1. The memory cell array 1 is divided into memory blocks (hereinafter, also referred to as blocks) BLOCK0 to BLOCKm. In this example, each of the blocks BLOCK0 to BLOCKm is the smallest unit of data erasing. Each of blocks BLOCK0 to BLOCKm includes a plurality of pages. A page is a unit of data reading or data writing. Each page corresponds to a word line WL, and includes data in a plurality of memory cells MC specified by a certain address.

An NAND type EEPROM performs a write operation and a read operation on a page-by-page basis. That is, the bit line controller BLC can perform the control of the bit lines BL in a page simultaneously. The sense amplifier SA detects data in a memory cell MC through a bit line BL.

Next, a data write operation to a memory according to the present embodiment will be described. A data write operation (write sequence) is performed by repeating a write loop including a write operation and a verify-read operation. The write operation is an operation for writing data by applying write voltage to a selected word line and raising the threshold voltage of the selected memory cell. The verify-read operation is an operation for verifying whether the threshold voltage of the selected memory cell has reached a verify level, that is, whether desired data has been written to the selected memory cell.

In the write sequence, each time the write loop is repeated, the word line driver 3 causes the voltage of the selected word line to be raised (stepped up) by ΔVpgm. Thus, the threshold voltage of the selected memory cell connected to the selected word line rises by about ΔVpgm each time the write loop is performed.

When the threshold voltage of the selected memory cell is gradually raised, in the verify-read, the threshold voltage of the selected memory cell gradually approaches the verify level (reference voltage), and then finally reaches the verify level. At this time, the selected memory cell MC passes the verification. When the selected memory cell MC passes the verification, writing to the selected memory cell MC is completed, and the bit line corresponding to the selected memory cell enters a non-selected (write-protected) state. For example, the bit line controller BLC raises and fixes the voltage of the bit line corresponding to the selected memory cell MC that passes the verification, and, even if write voltage is applied to the selected word line, reduces voltage applied to the selected memory cell. Accordingly, in the subsequent write loops, additional data is not written to the selected memory cell MC that has passed the verification. Therefore, the threshold voltage of the selected memory cell is at the verify level (reference voltage) or higher and is distributed in the vicinity thereof.

Note that a selected state means a state (write enable state) in which the voltage of the bit line is reduced so as not to reduce voltage applied to the selected memory cell, when write voltage is applied to the selected word line. A non-selected state means a state (write-protected state) in which the voltage of the bit line is fixed so as to reduce voltage applied to the selected memory cell, even when write voltage is applied to the selected word line.

The control of the write sequence is performed by the controller 5, the sense amplifier 2 and the row decoder (word line driver) 3. In addition, the write sequence is performed in order of the word line WL0, WL1, . . . WLn−1, WLn.

FIGS. 4A to 4D are graphs showing the threshold voltage distribution at each stage of a write sequence for writing 3-bit data to a page targeted for writing. The vertical axis in these graphs represents the number of selected memory cells MCs, and the horizontal axis represents the threshold voltage of the selected memory cell MCs. Note that the vertical axis is represented in logarithm.

In the memory according to the embodiment, 3-bit data is written to a memory cell MC in a foggy-fine method. The foggy-fine method is a method in which, after data at each level is roughly written by foggy writing, the data at each level is then accurately written by fine writing. In addition, LM (Lower Middle) writing may be performed before foggy writing. In the embodiment, the foggy-fine method includes LM writing, foggy writing and fine writing, and, at each stage, the above-mentioned write sequence is performed.

Hereinafter, a selected memory cell is denoted as MCs, and an adjacent memory cell is denoted as MC. A selected memory cell MCs is a memory cell connected to a selected word line WLs. An adjacent memory cell MC is a memory cell MC connected to a word line WL adjacent to a selected word line WLs. That is, an adjacent memory cell MC is a memory cell adjacent to a selected memory cell MCs in the extending direction of a bit line (in the Y direction in FIG. 2). For example, in FIG. 2, assuming that a selected memory cell MCs is MC1, the adjacent memory cell MC is MC0 or MC2.

Figure 4A:
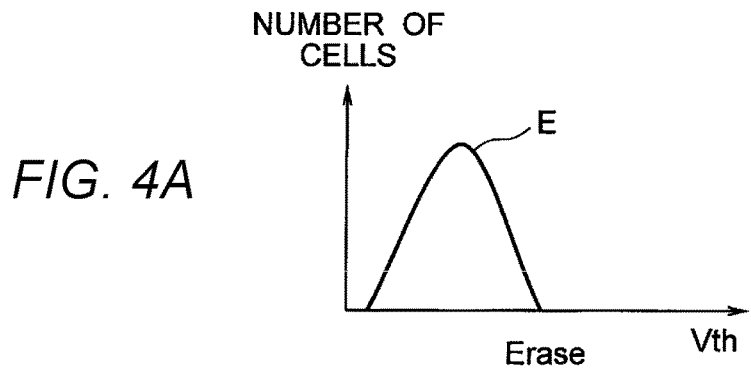
FIGS. 4A to 4D are graphs showing the threshold voltage distribution at each stage of a write sequence for writing 3-bit data to a page targeted for writing.

FIG. 4A shows a threshold voltage distribution of a selected memory cell MCs in its initial state (erase state). By a block erase operation, all of the memory cells MC in the block BLOCK are in an erased state (also referred to as an Er level). Therefore, the threshold voltage of each memory cell MC in the block BLOCK is at the lowest Er level in the logical data. Note that the level means the level of threshold voltage; hereinafter, Er<LM, Er<A<B<C<D<E<F<G.

(LM Writing)

Figure 4B:
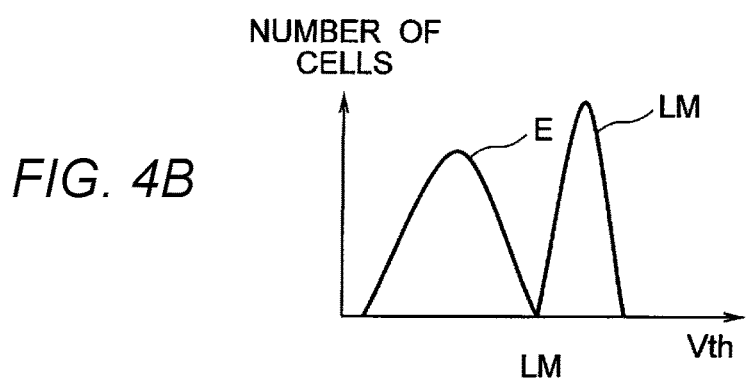

Next, LM writing (writing to lower page) is performed as shown in FIG. 4B. In LM writing, the threshold voltage of some selected memory cells MCs is raised from the Er level to the LM level. The selected memory cells MCs where LM level writing is performed are memory cells where data having a relatively high threshold voltage (for example, D, E, F or G level) is written thereafter. On the other hand, the selected memory cells MCs that are maintained at the Er level are memory cells where data having a relatively low threshold voltage (for example, A, B or C level) is written thereafter. By such LM writing, the threshold voltages of the selected memory cells MCs are divided into two distributions: the Er level and the LM level.

In LM writing, the write loop is repeatedly performed. When a selected memory cell MCs targeted for the LM level writing passes verify-read, the LM level writing is completed. The verify level (reference voltage) in the verify-read is set to, for example, the lower end of the threshold voltage distribution of the desired LM level. The selected memory cell MCs passes the verification when the threshold voltage exceeds the verify level. The selected memory cell MCs that passes the verification enters a non-selected state, as described above. Therefore, in the subsequent write loops in the LM writing, data is not written to the selected memory cell MCs.

(Foggy Writing)

Figure 4C:
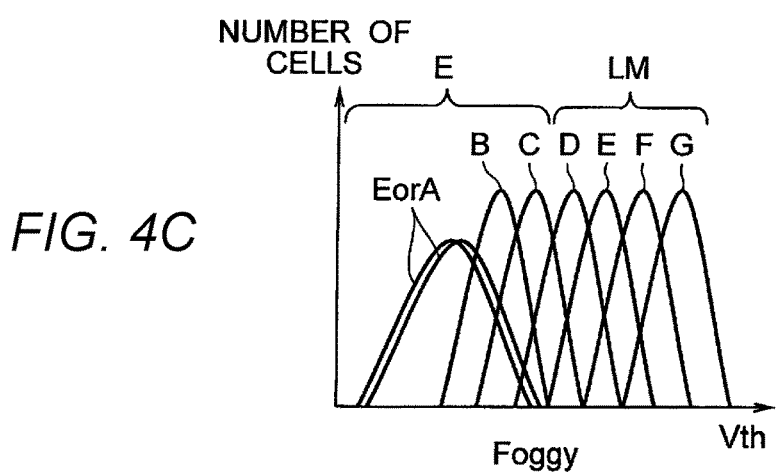

Next, writing to an upper page is performed. Writing to an upper page includes a foggy writing stage shown in FIG. 4C, and a fine writing stage shown in FIG. 4D. Foggy writing is at a stage where each data is roughly written. As shown in FIG. 4C, by the foggy writing, step-up writing of data at any of Er, A, B or C level is performed with relatively large ΔVpgm to a selected memory cell MCs at the Er level, that is, the data is roughly written. Similarly, data at any of D, E, F or G level is roughly written to a selected memory cell MCs at the LM level. In the foggy writing, the verify level is somewhat lower than that in the fine writing, and ΔVpgm is relatively higher. Therefore, in the foggy writing, when the rough writing is performed to write to the selected memory cells MCs, the threshold voltage distribution thereof falling into each of the B to G levels is widely distributed on the lower voltage side to the extent of not exceeding the upper limit of the threshold voltage distribution of each level in the fine writing.

Note that, at the foggy writing stage, writing to a selected memory cell MCs that is subject to the A level writing is not performed. That is, at the foggy writing stage, the selected memory cells MCs at the Er level and the A level substantially belong to the Er level, and are not clearly distinguished. This is because, at the foggy writing stage, the threshold voltage at the A level is very close to the threshold voltage at the Er level, and there is a possibility that the verify level at the A level is a negatively large voltage.

Also in the foggy writing step, the write loop is repeatedly performed. When a selected memory cell MCs targeted for writing passes verify-read at each level, the foggy writing is completed for that memory cell. The respective verify levels at B to G levels in verify-read are set to be larger in the order of B, C, D, E, F, G. As described above, the verify levels at B to G levels in the foggy writing are set to be somewhat lower than the verify levels at B to G levels in the fine writing. Further, ΔVpgm in the foggy writing is also set to be higher than that in the fine writing. Thus, the threshold voltage of the selected memory cell MCs at each of the B to G levels in the foggy writing does not exceed the threshold voltage corresponding to each of the B to G levels in the fine writing and has a wider distribution than that. In this manner, the data of the B to G levels are roughly written to the selected memory cells MCs in the foggy writing.

(Fine Writing)

Figure 4D:
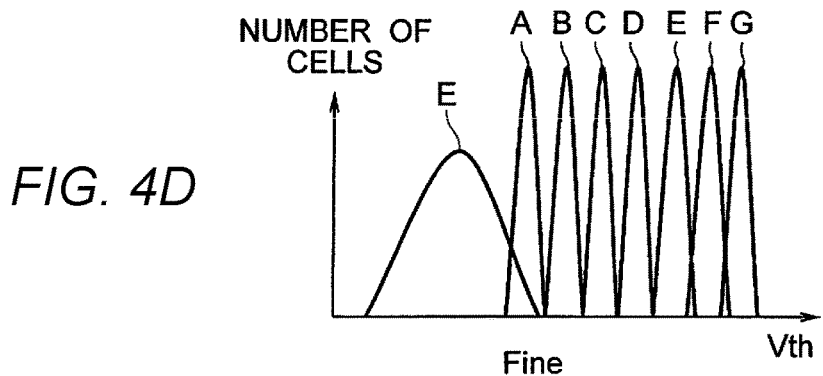

Fine writing is performed after foggy writing, and is at a stage where each data is accurately written within a threshold range narrower than that of the foggy writing. As shown in FIG. 4D, the threshold voltage of a selected memory cell MCs where rough writing is performed by the foggy writing is written within a desired threshold range by the fine writing.

At the fine writing stage, the data at the B to G levels are written, and the data at the A level is written from the Er level. Thus, in the fine writing, the selected memory cell MCs at the A level is distinguished from one at the Er level.

Also in the fine writing, the write loop is repeatedly performed. When a selected memory cell MCs targeted for writing passes verify-read at each level, the fine writing is completed. The respective verify levels at A to G levels in verify-read are set to be larger in the order of A, B, C, D, E, F, G. As described above, the verify levels at B to G levels in the fine writing are higher than the verify levels at B to G levels in the foggy writing, respectively, and are nearly equal to the reference voltage to be used for a normal read operation, or somewhat higher than the reference voltage of a read operation. Thus, the threshold voltage of each selected memory cell MCs is written to a desired threshold voltage distribution corresponding to each of the B to G levels in the fine writing. At the same time, the threshold voltage of the selected memory cell MCs that is subject to the A level writing is written to the threshold voltage distribution corresponding to the A level from the Er level. In this manner, in the fine writing, the threshold voltage of each selected memory cell MCs is written to the threshold voltage distribution corresponding to each of the A to G levels. The selected memory cell MCs at the Er level is kept unchanged, and writing is not performed. Thus, 3-bit data at the Er to G levels are written to the selected memory cell MCs.

Writing shown in FIGS. 4A to 4D is performed for each word line (page) WL in the block BLOCK. At this time, in order to suppress an inter-cell interference effect (proximity interference effect), the LM writing, the foggy writing and the fine writing are performed stepwise (gradually) between adjacent word lines WLs.

For example, FIG. 5 is a conceptual diagram showing the order in which data are written to word lines WL. Note that FIG. 5 shows the state of the memory cell MC connected to each of the five word lines WL0 to WL4 (5 pages), and the state of the memory cell MC connected to the word line WL5 or higher is not shown. Steps S1 to S16 show the order in a time series in which the LM writing, the foggy writing or the fine writing is performed.

First, in step S1, all the memory cells MC connected to the word lines WL 0 to WL 4 are in an erase state (Er level).

Next, in step S2, the LM writing is performed to the word line WL0. Thus, the threshold voltage distribution of the selected memory cell MCs connected to the word line WL0 is as shown in FIG. 4B.

Next, in step S3, the LM writing is performed to the word line WL1. Thus, the threshold voltage distribution of the selected memory cell MCs connected to the word line WL1 is as shown in FIG. 4B.

Next, in step S4, the foggy writing is performed to the word line WL0. Thus, the threshold voltage distribution of the selected memory cell MCs connected to the word line WL0 is as shown in FIG. 4C.

Next, in step S5, the LM writing is performed to the word line WL2. Thus, the threshold voltage distribution of the selected memory cell MCs connected to the word line WL2 is as shown in FIG. 4B.

Next, in step S6, the foggy writing is performed to the word line WL1. Thus, the threshold voltage distribution of the selected memory cell MCs connected to the word line WL1 is as shown in FIG. 4C.

Next, in step S7, the fine writing is performed to the word line WL0. Thus, the threshold voltage distribution of the selected memory cell MCs connected to the word line WL0 is as shown in FIG. 4D.

Next, in step S8, the LM writing is performed to the word line WL3. Thus, the threshold voltage distribution of the selected memory cell MCs connected to the word line WL3 is as shown in FIG. 4B.

Next, in step S9, the foggy writing is performed to the word line WL2. Thus, the threshold voltage distribution of the selected memory cell MCs connected to the word line WL2 is as shown in FIG. 4C.

Next, in step S10, the fine writing is performed to the word line WL1. Thus, the threshold voltage distribution of the selected memory cell MCs connected to the word line WL1 is as shown in FIG. 4D.

Next, in step S11, the LM writing is performed to the word line WL4. Thus, the threshold voltage distribution of the selected memory cell MCs connected to the word line WL4 is as shown in FIG. 4B.

Next, in step S12, the foggy writing is performed to the word line WL3. Thus, the threshold voltage distribution of the selected memory cell MCs connected to the word line WL3 is as shown in FIG. 4C.

Next, in step S13, the fine writing is performed to the word line WL2. Thus, the threshold voltage distribution of the selected memory cell MCs connected to the word line WL2 is as shown in FIG. 4D.

Next, in step S14, the LM writing is performed to the word line WL5, which is not shown. Thus, the threshold voltage distribution of the selected memory cell MCs connected to the word line WL5 is as shown in FIG. 4B.

Next, in step S15, the foggy writing is performed to the word line WL4. Thus, the threshold voltage distribution of the selected memory cell MCs connected to the word line WL4 is as shown in FIG. 4C.

Next, in step S16, the fine writing is performed to the word line WL3. Thus, the threshold voltage distribution of the selected memory cell MCs connected to the word line WL3 is as shown in FIG. 4D.

In this manner, wiring to a memory cell MC connected to a word line WLn does not precede writing to a memory cell MC connected to a word line WLn±1 adjacent thereto by two or more stages. For example, the memory cell MC connected to the word line WL0 enters an LM state (a state in which the LM writing has already been performed) earlier than the memory cell MC connected to the word line WL1 adjacent thereto, but does not enter a foggy state (a state in which the foggy writing has already been performed) before the memory cell MC connected to the word line WL1 enters an LM state. Further, the memory cell MC connected to the word line WL0 enters a foggy state earlier than the memory cell MC connected to the word line WL1, but does not enter a fine state (a state in which the fine writing has already been performed) before the memory cell MC connected to the word line WL1 enters a foggy state. Namely, wiring to the memory cell MC connected to the word line WL0 does not precede writing to the memory cell MC connected to the word line WL1 adjacent thereto by two or more stages. In this manner, 3-bit data can be written to a memory cell MC while suppressing an inter-cell interference effect.

Note that, when a selected memory cell MCs is in an erase state, an LM state and a foggy state, even when it is subject to an inter-cell interference effect, the threshold voltage distribution may be modified by subsequent writing. Therefore, when a selected memory cell MCs is in an erase state, an LM state or a foggy state, an inter-cell interference effect is insignificant. Additionally, once a selected memory cell MCs has been written in the fine state, writing to that selected memory cell MCs has been completed, and thus, when it is subject to an inter-cell interference effect by writing to an adjacent cell, the state of writing of the memory cell is not modified.

Here, when the fine writing is performed to a word line, the fine writing to the memory cell MC connected to an adjacent word line to one end of the word line has already been completed. For example, in steps S9 and S10, when the fine writing is performed on the adjacent memory cell MC connected to the adjacent word line WL1, the selected memory cell MCs connected to the selected word line WL0 has already entered a fine state.

As described above, in the foggy writing, data at the B to G levels are roughly written to the adjacent memory cell MC. Accordingly, in the fine writing of the adjacent memory cell MC, writing of data at the B to G levels does not significantly shift the threshold voltage of the adjacent memory cell MC. Therefore, performing the fine writing of data at the B to G levels to the adjacent memory cell MC does not provide a significant inter-cell interference effect to the selected memory cell MCs. However, data at the A level is included in the Er level, and, in the fine writing, the data greatly transitions from the Er level to the A level. Therefore, when the fine writing of data at the A level is performed to the adjacent memory cell MC, the threshold voltage of the selected memory cell MCs relatively significantly rises. Namely, performing the fine writing of data at the A level to the adjacent memory cell MC provides a relatively large inter-cell interference effect to the selected memory cell MCs.

For example, in the fine writing of steps S9 and S10 shown by an arrow A1 in FIG. 5, when data at the A level is written to the memory cell MC connected to the word line WL1, the memory cell MC connected to the word line WL0 is subject to a relatively large inter-cell interference effect. Thus, the threshold voltage distribution of the memory cell MC connected to the word line WL0 is spread to the high voltage side.

In addition, in the fine writing of steps S12 and S13 shown by an arrow A2 in FIG. 5, when data at the A level is written to the memory cell MC connected to the word line WL2, the memory cell MC connected to the word line WL1 is subject to a relatively large inter-cell interference effect. Thus, the threshold voltage distribution of the memory cell MC connected to the word line WL1 is spread to the high voltage side.

Further, in the fine writing of steps S15 and S16 shown by an arrow A3 in FIG. 5, when data at the A level is written to the memory cell MC connected to the word line WL3, the memory cell MC connected to the word line WL2 is subject to a relatively large proximity interference effect. Thus, the threshold voltage distribution of the memory cell MC connected to the word line WL2 is spread to the high voltage side.

Thus, depending on the logic of the write data to an adjacent memory cell, a selected memory cell MCs where the fine writing is performed previously may be subject to a relatively large inter-cell interference effect.

Figure 6:
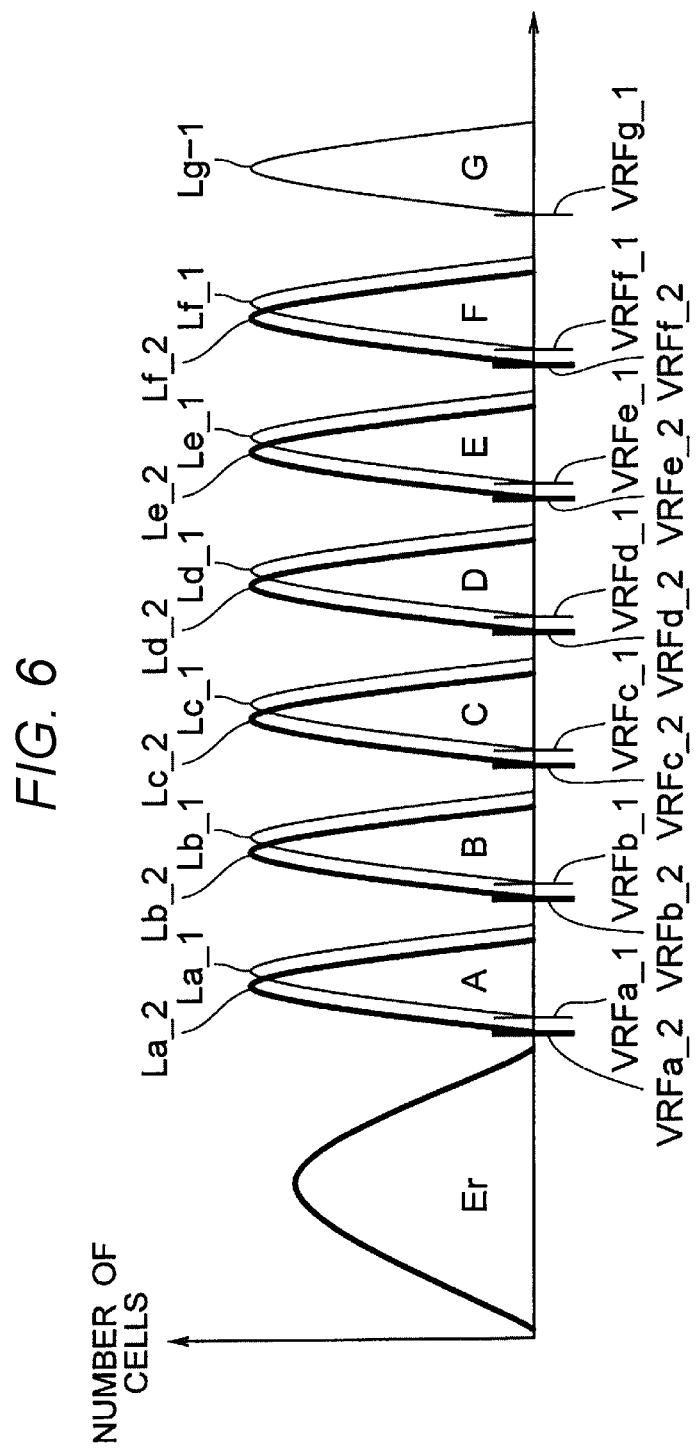
FIG. 6 is a graph showing verify levels and threshold voltage distribution of memory cells MC according to the first embodiment.

Therefore, in the embodiment, based on the logic of the write data to an adjacent memory cell MC that is to be written later than a selected memory cell MCs, the controller 5 changes the verify level (reference voltage) used for the verify operation of the selected memory cell MCs. In this case, for the same writing level, a plurality of verify levels are required for the fine writing. A plurality of verify levels are previously stored in the ROM fuse 7 or the data storage circuit 8. For example, the first and second verify levels VRFa_1 to VRFg_1, VRFa_2 to VRFf_2 shown in FIG. 6 are previously stored in the ROM fuse 7 or the data storage circuit 8. Further, the controller 5 is required to refer to write data for an adjacent memory cell MC to be written later than a selected memory cell MCs. Therefore, the I/O buffer 4 serving as a storage unit stores data written to a selected memory cell MCs connected to a selected word line WLs, as well as data to be subsequently written to an adjacent memory cell MC connected to an adjacent word line WL. In other words, the I/O buffer stores data of a plurality of pages corresponding to a plurality of adjacent word lines WL. Note that the write data to a selected memory cell MCs and an adjacent memory cell MC may be stored in a storage unit (not shown) provided in the sense amplifier circuit 2.

Hereinafter, with reference to FIG. 6, a variation of the verify level will be described. Here, the write data to a selected memory cell MCs corresponds to "first data", and the write data to an adjacent memory cell MC corresponds to "second data".

FIG. 6 is a graph showing verify levels and threshold voltage distribution of memory cells MC according to the first embodiment. Er to G in FIG. 6 represent the threshold voltage distribution of the selected memory cells MCs after the fine writing at the Er to G levels (threshold voltage distribution of the first data). The verify level VRFa_1 to VRFg_1 represents a first verify level as first reference voltage. The verify level VRFa_2 to VRFf_2 represents a second verify level as second reference voltage. Note that, in the embodiment, VRFg_2 is not set. Since the G level is the highest level of the threshold voltage in the Er to G levels, even if the threshold voltage at the G level is shifted to the higher voltage side due to an inter-cell interference effect, the sense amplifier SA can detect G-level data without problems. Therefore, the second verify level at the G level may be the same as the first verify level VRFg_1.

The first verify level VRFa_1 to VRFg_1 is a verify level to be used in the normal fine writing. The first verify level VRFa_1 to VRFg_1 is used for verify-read of each write loop of a selected memory cell MCs when the write data (second data) to an adjacent memory cell is at a level (for example, the Er or B to G level) other than a predetermined level (for example, A level). In this case, the controller 5 uses the first verify level VRFa_1 to VRFg_1 in the verify-read of each write loop of a selected memory cell MCs. When the threshold voltage of the selected memory cell MCs exceeds the first verify level (any of VRFa_1 to VRFg_1) corresponding to the write data (first data) to the selected memory cell MCs, the fine writing of the selected memory cell MCs is completed. The threshold voltage distribution of the selected memory cell MCs after the fine writing is shown by the thin lines La_1 to Lg_1 in FIG. 6.

The second verify level VRFa_2 to VRFf_2 is the verify level in the consideration of an inter-cell interference effect. The second verify level VRFa_2 to VRFf_2 is used for verify-read of each write loop of a selected memory cell MCs when the write data (second data) to an adjacent memory cell MC is at a predetermined level (for example, A level). In this case, the controller 5 uses the second verify level VRFa_2 to VRFf_2 in the verify-read of each write loop of a selected memory cell MCs. When the threshold voltage of the selected memory cell MCs exceeds the second verify level (any of VRFa_2 to VRFf_2) corresponding to the write data (first data) to the selected memory cell MCs, the fine writing of the selected memory cell MCs is completed. In this case, the threshold voltage distribution of the selected memory cell MCs after the fine writing is shown by the bold lines La_2 to Lf_2 and the thin line Lg_1 in FIG. 6.

The first and second verify levels VRFa_1 to VRFg_1, VRFa_2 to VRFf_2 are set to the voltage of the lower end of the threshold voltage distribution of each of desired Er to G levels. However, the voltage of each second verify level VRFa_2 to VRFf_2 is lower than that of each first verify level VRFa_1 to VRFf_1. Therefore, when the first verify level VRFa_1 to VRFg_1 is used, as shown by the thin lines La_1 to Lg_1 in FIG. 6, the threshold voltage distribution of the voltage of the selected memory cell MCs after the fine writing is relatively higher than that of when the second verify level VRFa_2 to VRFf_2 is used. As shown by the bold lines La_2 to Lf_2 in FIG. 6, the threshold voltage distribution of the selected memory cell MCs after the fine writing is lower than that shown by the thin lines La_1 to Lg_1 when the second verify level VRFa_2 to VRFf_2 is used.

In this manner, according to the embodiment, when the write data (second data) to the adjacent memory cell MC is at a predetermined level (for example, A level), the controller 5 reduces the verify level used to complete the writing to the selected memory cell MCs from the first verify level to the second verify level. Thus, the threshold voltage of the selected memory cell MCs is set to be lower in advance. For example, the threshold voltage of the selected memory cell MCs is set within the threshold range shown by the bold lines La_2 to Lg_2 in FIG. 6. Accordingly, when the fine writing of the adjacent memory cell MC is performed, the threshold voltage of the selected memory cell MCs rises due to an inter-cell interference effect, and is shifted to the threshold range shown by the thin lines La_1 to Lf_1 from the threshold range shown by the bold lines La_2 to Lf_2. That is, the threshold voltage of the selected memory cell MCs rises due to an inter-cell interference effect, but the effect of the rise is canceled out to some extent. In this manner, even when being subject to an inter-cell interference effect, the threshold voltage of the selected memory cell MCs may be put in a desired threshold range (range shown by the thin lines La_1 to Lf_1 in FIG. 6).

On the other hand, when the write data to the adjacent memory cell MC is at a level (for example, Er or B to G level) other than a predetermined level (for example, A level), the controller 5 maintains the verify level used to complete the writing to the selected memory cell MCs at the first verify level. Therefore, writing to the selected memory cell MCs is performed such that the threshold voltage thereof is put in a desired threshold range (range shown by the thin lines La_1 to Lg_1 in FIG. 6). Accordingly, when the inter-cell interference effect is relatively small, the threshold voltage of the selected memory cell MCs can be put in a desired threshold range from the beginning. In this case, even when the fine writing of data to the adjacent memory cell MC is performed, the threshold voltage of the selected memory cell MCs is not significantly changed, therefore, the threshold voltage of the selected memory cell MCs maintains the desired threshold voltage distribution.

In this manner, according to the embodiment, even when the inter-cell interference effect is relatively large, or even when it is relatively small, the threshold voltage of the selected memory cell MCs may be put in a desired threshold range, thus, it is possible to attain a desired threshold voltage distribution (thin lines La_1 to Lg_1 in FIG. 6) of the selected memory cell MCs. As a result, the memory according to the embodiment is capable of narrowing the threshold voltage distribution of a memory cell MC while achieving miniaturization.

Figure 7:
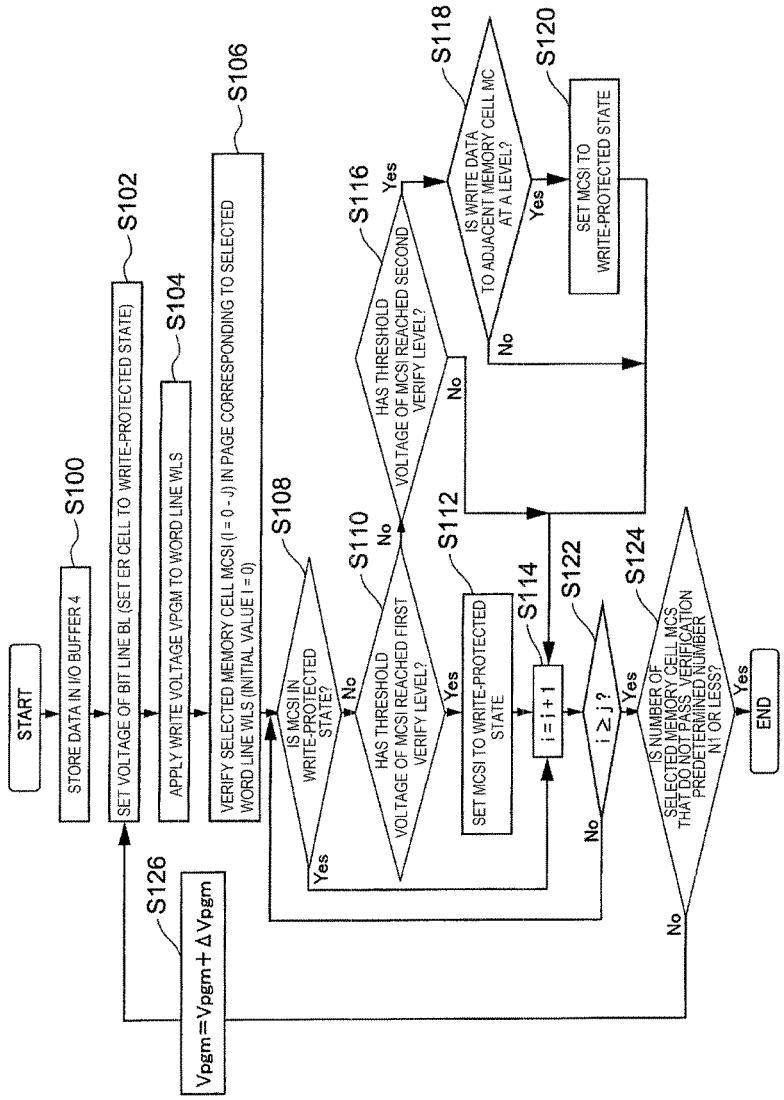
FIG. 7 is a flow diagram showing an example of a fine write sequence according to the first embodiment.

FIG. 7 is a flow diagram showing an example of a fine write sequence according to the first embodiment. FIG. 7 shows the writing to a selected memory cell MCs connected to a selected word line WLs.

First, data to be written to a selected memory cell MCs and an adjacent memory cell MC are stored in the I/O buffer 4 (S100).

Next, the bit line controller BLC applies low level voltage to a selected bit line BLs, and fixes other non-selected bit lines BL to high level voltage (S102). This causes the non-selected bit lines BL to enter a write-protected (inhibit) state. Note that the selected bit line BL connected to the selected memory cell MCs where the Er level writing is performed is also fixed to high level voltage so as to enter a write-protected state.

Next, a word line driver WDRV applies write voltage Vpgm to the selected word line WLs (S104). Thus, the writing is performed to the selected memory cell MCs connected to the selected bit line BLs and the selected word line WLs.

Next, the controller 5 performs a verify-read operation on the selected memory cells MCs in the page corresponding to the selected word line WLs (S106). For example, for the selected memory cell MCsi (i=0-j) corresponding to the bit line BLi, the verify-read operation is performed in the order of i. The initial value of i is 0. Note that, for the selected memory cell MCsi that is in a write-protected state, no verification is performed (skipped), and i is incremented to i+1 (YES in S108).

If the selected memory cell MCsi is not in a write-protected state (NO in S108), the controller 5 determines whether the threshold voltage of the selected memory cell MCsi has reached the first verify level (S110). If the threshold voltage of the selected memory cell MCsi has already reached the first verify level (YES in S110), the controller 5 sets the selected memory cell MCsi to a write-protected state, and increments i to i+1 (S112, S114). The bit line BL connected to the selected memory cell MCsi in a write-protected state is fixed to a high level voltage. Note that, at the beginning of the write sequence, selected memory cells MCs are at the Er level, therefore, the threshold voltage of most of the selected memory cells MCs has not yet reached the first verify level.

If the threshold voltage of the selected memory cell MCsi has not reached the first verify level (NO in S110), the controller 5 determines whether the threshold voltage of the selected memory cell MCsi has reached the second verify level (S116). If the threshold voltage of the selected memory cell MCsi has not reached the second verify level (NO in S116), the controller 5 maintains the selected memory cell MCsi in a selected state, and increments i to i+1 (S114). In this case, the threshold voltage of the selected memory cell MCsi does not reach even the second verify level lower than the first verify level, which is fairly low. Therefore, the controller 5 maintains the selected memory cell MCsi in a selected state, and, as described later, steps up the voltage of the selected word line WLs, and performs writing again.

On the other hand, when the threshold voltage of the selected memory cell MCsi has reached the second verify level (YES in S116), the threshold voltage of the selected memory cell MCs has not reached the first verify level, but has reached the second verify level. Here, the controller 5 refers to the write data (second data) to the adjacent memory cell MC which is stored in the I/O buffer 4. The controller 5 determines whether the write data to the adjacent memory cell MC is the data at a predetermined level (for example, A level) (S118).

When the write data to the adjacent memory cell MC is at the Er or B to G level other than the A level (NO in S118), the controller 5 maintains the selected memory cell MCsi in a selected state, and increments i to i+1 (S114). As described above, when the write data to the adjacent memory cell MC is at the Er or B-G level and other than the A level, the shift (rise width) of the threshold voltage of the selected memory cell MCs due to an inter-cell interference effect is relatively small. In this case, writing to the selected memory cell MCs is continued until the threshold voltage reaches the first verify level. In other words, the controller 5 selects the first verify level. Therefore, even if the threshold voltage of the selected memory cell MCs exceeds the second verify level, the controller 5 maintains the selected memory cell MCsi in a selected state, and steps up the voltage of the selected word line WLs, and repeats writing until the threshold voltage reaches the first verify level.

On the other hand, when the write data to the adjacent memory cell MC is at the A level (YES in S118), the controller 5 sets the selected memory cell MCsi to a write-protected state, and increments i to i+1 (S120, S114). The bit line BL connected to the selected memory cell MCsi in a write-protected state is fixed to high level voltage. As described above, when the write data to the adjacent memory cell MC is at the A level, the shift (rise width) of the threshold voltage of the selected memory cell MCs due to an inter-cell interference effect is relatively large. In this case, writing to the selected memory cell MCs is completed when the threshold voltage reaches the second verify level. That is, the controller 5 changes the verify level from the first verify level to the second verify level. In other words, the controller 5 selects the second verify level. Therefore, when the threshold voltage of the selected memory cell MCs reaches the second verify level, the controller 5 sets the selected memory cell MCsi to a write-protected state.

In step S114, after incrementing i to i+1, the controller 5 determines whether i has reached j (S122). That is, the controller 5 determines whether the verification of all the selected memory cells MCs0 to MCj in the page corresponding to the selected word line WLs is completed. When i has not reached j, and there is a selected memory cell MCs where verification is not completed within the page (NO in S122), the controller 5 repeats the steps S108 to S120.

On the other hand, when i has reached j, and the verification of all the selected memory cells MCs in the page is completed (YES in S122), the controller 5 determines whether the number of the selected memory cells MCs (the selected memory cell MCsi which is not in a non-selected state, and where writing is not completed) that do not pass the verification is the predetermined number N1 or less (S124). When the number of the selected memory cells MCs that do not pass the verification is larger than the predetermined number N1 (NO in S124), the controller 5 steps up the write voltage of the selected word line WLs from Vpgm to Vpgm+ΔVpgm (S126), and performs the subsequent write loop (S102 to S122). At this time, the controller 5 puts the bit line BL for the selected memory cell MCsi where writing is completed in an non-selected state (write-protected state) (S102), so as not to write data to the selected memory cell MCs in the subsequent write loops. On the other hand, the controller 5 maintains the bit line BL for the selected memory cell MCsi where writing is not completed in a selected state (write enable state), so as to write data to the selected memory cell MCs in the subsequent write loops.

In this manner, when the write loop (S102 to S116) is repeated, and the number of the selected memory cell MCs where writing is not completed reaches the predetermined number N1 or less (YES in S115), the fine write sequence to the selected word line WLs (the page) is completed.

Then, the next adjacent word line WL is taken as a selected word line, and the write sequence is performed. When the write sequence is performed on all the word lines WL0 to WLn (all pages), writing to the block BLOCK is completed.

In this manner, in the embodiment, when the write data to an adjacent memory cell MC is at the Er or B to G level other than the A level (NO in S118), the controller 5 uses the first verify level (first reference voltage) to verify the selected memory cell MCs. When the write data to the adjacent memory cell MC is at the A level (YES in S118), the controller 5 uses the second verify level (second reference voltage) lower than the first verify level to verify the selected memory cell MCs.

Thus, when the write data to an adjacent memory cell MC is at the Er or B to G level other than the A level (NO in S118), writing to the selected memory cell MCs is performed such that the threshold voltage reaches the first verify level. On the other hand, when the write data to an adjacent memory cell MC is at A level (YES at S118), writing to the selected memory cell MCs is performed such that the threshold voltage reaches the second verify level. As a result, the threshold voltage of the selected memory cell MCs is written to a threshold voltage level in consideration of the inter-cell interference effect.

When the foggy-fine method described above is utilized, for example, the fine writing from the Er level to the A level provides a large inter-cell interference effect. That is, when the write data (second data) to the adjacent memory cell MC is the data at the A level which is logically one level higher than the Er level, writing to the adjacent memory cell MC provides a large inter-cell interference effect to the selected memory cell MCs. Therefore, in such a case, the controller 5 reduces the verify level from the first verify level to the second verify level, and sets the threshold voltage of the selected memory cell MCs to be lower in advance. As a result, even if it is subject to the inter-cell interference effect, the threshold voltage distribution of the selected memory cell MCs may be closer to the desired distribution.

On the other hand, the data at the B to G levels are written to some extent by the foggy writing. Therefore, the fine writing of data at the B to G levels to the adjacent memory cell MC does not provide a large inter-cell interference effect. That is, when the write data (second data) to the adjacent memory cell MC is the data at the level which is logically two or more levels higher than the Er level, writing to the adjacent memory cell MC does not provide a large inter-cell interference effect to the selected memory cell MCs. Therefore, in such a case, the controller 5 maintains the verify level at the first verify level to attain the desired distribution of the threshold voltage of the selected memory cell MCs.

Of course, in a writing method other than the foggy-fine method, when the fine writing of the data at the level which is logically two or more levels higher than the Er level is performed to the adjacent memory cell MC, it may provide a large inter-cell interference effect to the selected memory cell MCs. In this case, when the fine writing of the data at the level which is logically two or more levels higher than the Er level is performed to the adjacent memory cell MC, the controller 5 may reduce the verify level from the first verify level to the second verify level at the time of the fine writing to the selected memory cell MCs.

Modification Example

Figure 8:
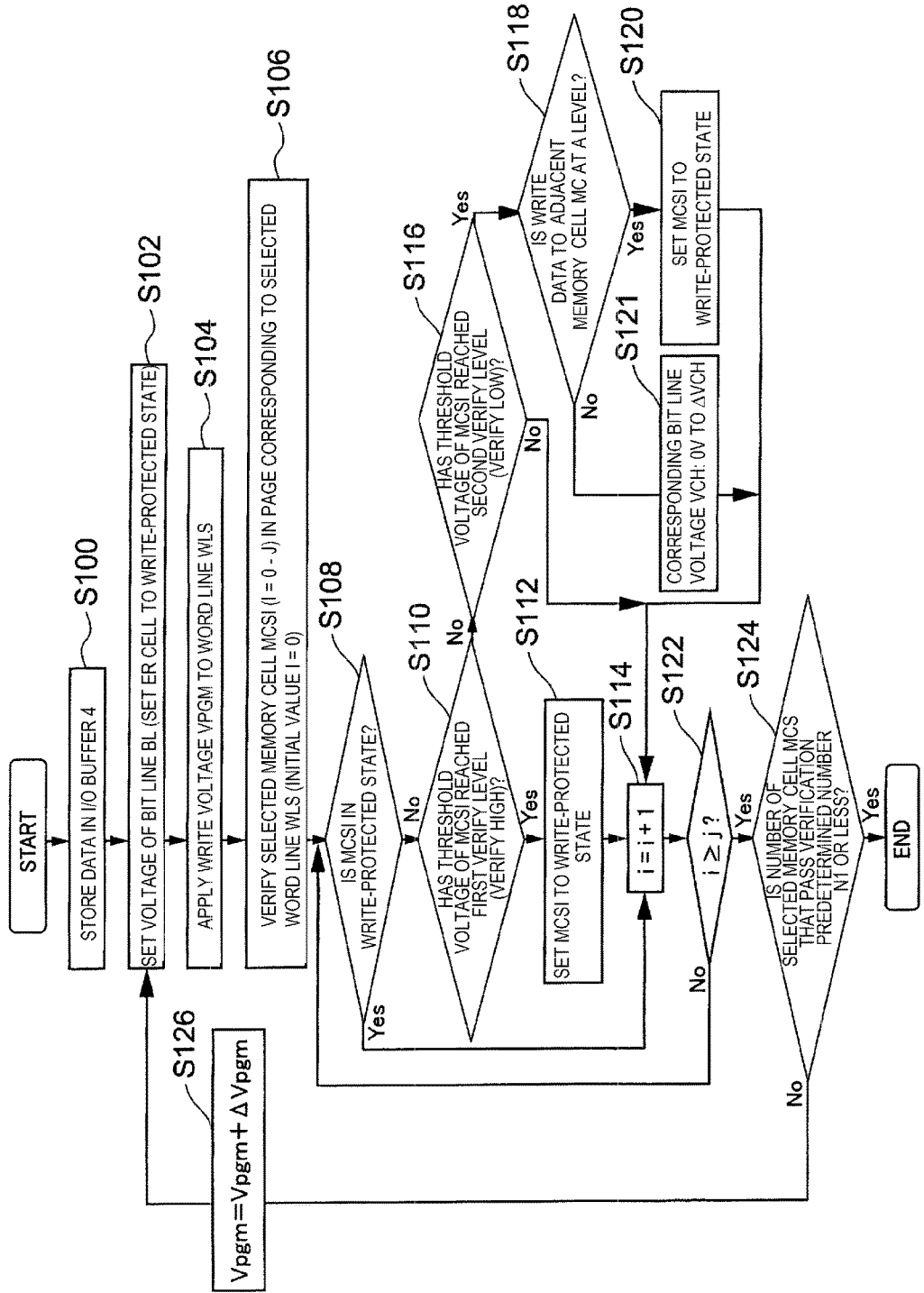
FIG. 8 is a flow diagram showing an example of a fine write sequence according to a variation of the first embodiment.

FIG. 8 is a flow diagram showing an example of a fine write sequence according to a modification example of the first embodiment. In the modification example, by utilizing a plurality of verify levels in a QPW method, the fine writing of the first embodiment is performed.

In the NAND type EEPROM, data may be written by using the QPW (Quick Pass Write) method. In the QPW method, in the write sequence, when the threshold voltage of the selected memory cell exceeds the verify low level, the bit line controller BLC raises a voltage Vch of the bit line BL corresponding to the selected memory cell MCs where the verify low level is exceeded by voltage ΔVch (ΔVch=0 to 2ΔVpgm) which is the same level as ΔVpgm. This alleviates the rise in the write voltage applied to the selected memory cell MCs, and, in the write loop, gradually raises the threshold voltage of the selected memory cell MCs. After that, the controller 5 completes the write sequence to the selected memory cell MCs when the threshold voltage of the selected memory cell MCs exceeds the verify level.

For example, until the threshold voltage of the selected memory cell MCs reaches the verify low level, the word line driver WDRV raises the write voltage Vpgm of the selected word line WLs with a relatively large step-up width ΔVpgm (for example, 0.3 V) each time the write loop is performed. At this time, the bit line controller BLC causes the bit line voltage corresponding to the selected memory cell MCs to be substantially 0 V. Thus, the threshold voltage of the selected memory cell MCs is greatly shifted toward the verify low level, and the writing to the selected memory cell MCs is performed faster.

After the threshold voltage of the selected memory cell MCs has reached the verify low level, and until it reaches to the verify high level, the bit line controller BLC sets the voltage Vch of the bit line BL corresponding to the selected memory cell MCs from 0 V to ΔVch (for example, 0.4 V). Thus, the threshold voltage of the selected memory cell MCs is slightly shifted toward the verify high level, and gradually written. By utilizing the QPW method, the threshold voltage of the selected word line WLs is concentrated in the vicinity of the verify high level so as to extremely narrow the threshold voltage distribution.

In such the QPW method, a plurality of verify levels have already been set and stored in the ROM fuse 7 or the data storage circuit 8 in advance. The first and second verify levels of the first embodiment may be the verify high level and verify low level used for the QPW method, respectively. Namely, by utilizing the verify high level and verify low level in the QPW method as the first and second verify levels, the fine writing of the first embodiment may be performed.

With reference to the flow diagram of FIG. 8, the fine writing according to the variation will be described.

First, as in the first embodiment, the steps S100 to S118 are performed. Here, the verify high level is used for the first verify level of step S110. The verify low level is used for the second verify level of step S116.

When the threshold voltage of the selected memory cell MCs has not reached the first and second verify levels (NO in S116), in the subsequent write loop, the bit line controller BLC maintains the voltage Vch of the bit line BL corresponding to the selected memory cell MCs at 0 V, and performs step S114 and later. That is, in step S116, until the threshold voltage of the selected memory cell MCs reaches the second verify level, the controller 5 performs the write loop (from S102 to S124). The operation itself of the write loop is similar to the operation of the write loop in the first embodiment.

On the other hand, when the threshold voltage of the selected memory cell MCsi reaches the second verify level (YES in S116), the controller 5 refers to the write data (second data) to the adjacent memory cell MC which is stored in the I/O buffer 4. The controller 5 determines whether the write data to the adjacent memory cell MC is the data at a predetermined level (for example, A level) (S118).

When the write data to the adjacent memory cell MC is at the B to G level and not the A level (NO in S118), the controller 5 changes the voltage Vch of the bit line BL corresponding to the selected memory cell MCs from 0V to ΔVch (S121). Namely, when the threshold voltage of the selected memory cell MCs is between the first verify level and the second verify level (YES in S116), and the write data is at the B to G level and not the A level (NO in S118), in the subsequent write loop, the bit line controller BLC sets the voltage Vch of the bit line BL corresponding to the selected memory cell MCs from 0 V to ΔVch. Thus, writing to the selected memory cell MCs is performed by the QPW method, and the threshold voltage of the selected memory cell MCs is gradually raised.

After that, the controller 5 performs step S114 and later. That is, in step S110, until the threshold voltage of the selected memory cell MCs reaches the first verify level, the controller 5 performs the write loop (from S102 to S124). If the threshold voltage of the selected memory cell MCs has reached the first verify level (YES in S110), the selected memory cell MCs enters a write-protected state (S112), and writing to the selected memory cell MCs is completed.

On the other hand, when the write data to the adjacent memory cell MC is at the A level (YES in S118), the controller 5 sets the selected memory cell MCsi to a write-protected state (S120). In this case, as in the first embodiment, the controller 5 performs step S114, and does not perform QPW. Namely, if the write data to the adjacent memory cell MC is at the A level, when the threshold voltage of the selected memory cell MCs reaches the second verify level (verify low level), the writing is completed without using the first verify level (verify high level). Thus, the threshold voltage of the selected memory cell MCs is written to a level in consideration of the inter-cell interference effect.

When the write loop (S102 to S122) is repeated, and the number of the selected memory cell MCs where writing is not completed reaches the predetermined number N1 or less (YES in S124), the fine write sequence to the selected word line WLs is completed. Then, the next adjacent word line WL is taken as a selected word line, and the write sequence is performed.

In this manner, in the modification example, by utilizing a plurality of verify levels (verify low level and verify high level) in the QPW method, the fine writing is performed in consideration of an inter-cell interference effect. Thus, in the modification example, it is possible to achieve the same effects as in the first embodiment without newly generating a first verify level and a second verify level.

Further, according to the modification example, when the write data to the adjacent memory cell MC is at a level other than the A level, a normal QPW is performed; on the other hand, when the write data to the adjacent memory cell MC is at the A level, the writing is completed when the threshold voltage of the selected memory cell MCs reaches the verify low level. Therefore, writing is accomplished without increasing the write time of QPW, because when the write data is at the A level, the write time is reduced while narrowing the threshold voltage distribution of the memory cell MC.

Note that, in the embodiment, each of the memory cells MC stores 3-bit data, but each memory cell MC may store data of 2 bits or less or 4 bits or more.

Second Embodiment

In the first embodiment, an inter-cell interference effect between adjacent word lines WL (between adjacent pages) is considered. In the second embodiment, an inter-cell interference effect between adjacent bit lines BL is considered. That is, the proximity interference effect between the memory cells adjacent to each other in the extending direction of the word line (X direction in FIG. 1 or FIG. 2) is considered. Thus, the adjacent memory cell MC in the second embodiment means a memory cell MC that is connected to the adjacent bit line adjacent to at least one of the selected bit line connected to the selected memory cell MCs, and adjacent to the selected memory cell MCs in the extending direction of the word line.

In this case, a plurality of memory cells MC adjacent to each other belong to the same page. Therefore, the I/O buffer 4 does not need to store data of a plurality of pages as long as it can store the data of the page to be written.

In addition, usually, in the same page, writing of data at a lower level is completed earlier, and it takes a longer time to complete writing data at higher level. Therefore, if the threshold voltage of the write data to the adjacent memory cell is higher than that of the write data to the selected memory cell MCs, the selected memory cell MCs is susceptible to an inter-cell interference effect. In the second embodiment, writing is performed in consideration of such an inter-cell interference effect. Note that the configuration of the memory according to the second embodiment may be the same as that of the first embodiment.

In the following embodiment, an example in which 2-bit data is stored in each memory cell MC is illustrated. However, each memory cell MC may store data of less than 2 bits or 3 bits or more.

Figure 9:
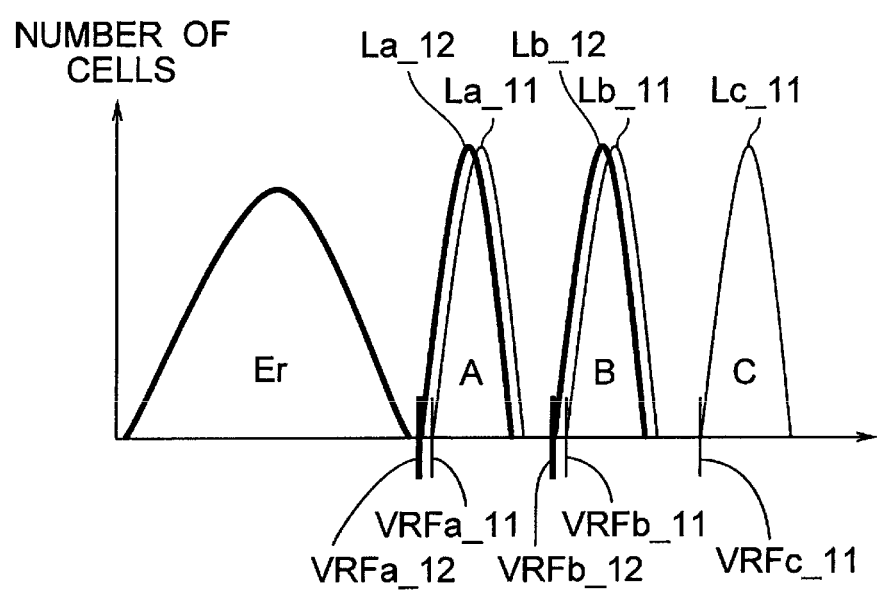
FIG. 9 is a graph showing verify levels and threshold voltage distribution of memory cells MC according to a second embodiment.

FIG. 9 is a graph showing verify levels and threshold voltage distribution of memory cells MC according to the second embodiment. The voltage distributions Er to C in FIG. 9 represent the threshold voltage distribution of the selected memory cells MCs after the fine writing at the Er to C levels (threshold voltage distribution of the first data). The verify level VRFa_11 to VRFc_11 represents a first verify level as first reference voltage. The verify level VRFa_12, VRFb_12 represents a second verify level as second reference voltage.

The verify level at the time of the fine writing to a selected memory cell MCs is changed (reduced) based on the write data (second data) to one or more adjacent memory cells MC adjacent to one or both of the selected memory cell MCs. For example, when the write data to one or more adjacent memory cells MC is data with a higher threshold voltage (for example, B, C level) than the write data (for example, A level) to the selected memory cell MCs, the controller 5 reduces the verify level used for the verification of the selected memory cell MCs from the first verify level to the second verify level. When the write data to one or more adjacent memory cells MC is at the level equal to or less than the write data to the selected memory cell MCs (for example, Er, A level), the controller 5 maintains the verify level used for the verification of the selected memory cell MCs at the first verify level. Namely, based on the comparison between the write data to the adjacent memory cell MC and the write data to the selected memory cell MCs, the controller 5 changes the verify level used for the verification of the selected memory cell MCs.

Note that VRFc_12 is not set. Since the C level is the highest level of the threshold voltage in the Er to C levels, even if the threshold voltage at the C level is shifted to the high voltage side due to an inter-cell interference effect, the sense amplifier SA can certainly detect C-level data. Therefore, the second verify level at the C level is the same as the first verify level VRFc_1.

The first verify level VRFa_11 to VRFc_11 is a verify level to be used in the normal fine writing. When the write data to the adjacent memory cell MC is at the level (for example, Er, A level) equal to or less than the level of the write data (for example, A level) to the selected memory cell MCs, the controller 5 selects the first verify level VRFa_11 to VRFg_11 in the verify-read of each write loop of a selected memory cell MCs. When the threshold voltage of the selected memory cell MCs exceeds the first verify level (any of VRFa_11 to VRFc_11) corresponding to the write data (first data), the fine writing of the selected memory cell MCs is completed. In this case, the threshold voltage distribution of the selected memory cell MCs after the fine writing is shown by the thin lines La_11 to Lg_11 in FIG. 9.

The second verify level VRFa_12, VRFb_12 is the verify level in the consideration of an inter-cell interference effect. When the write data to the adjacent memory cell MC is at the level (for example, B, C level) higher than the level of the write data to the selected memory cell MCs, the controller 5 selects the second verify level VRFa_12, VRFb_12 in the verify-read of each write loop of a selected memory cell MCs. When the threshold voltage of the selected memory cell MCs exceeds the second verify level (any of VRFa_12, VRFb_12) corresponding to the write data, the fine writing of the selected memory cell MCs is completed. The threshold voltage distribution of the selected memory cell MCs after the fine writing is shown by the bold lines La_12, Lb_12 and the thin line Lc_1 in FIG. 9.

Both of the first and second verify levels are set to the voltage of the lower end of the threshold voltage distribution of the desired Er to C levels. However, the voltage of each second verify level VRFa_12, VRFb_12 is lower than that of each first verify level VRFa_11, VRFb_11. Therefore, when the first verify level VRFa_11 to VRFc_11 is used for the verify-read of the selected memory cell MCs, as shown by the thin lines La_11 to Lc_11 in FIG. 9, the threshold voltage distribution of the selected memory cell MCs after the fine writing is relatively high. When the second verify level VRFa_12, VRFb_12 is used for the verify-read of the selected memory cell MCs, as shown by the bold lines La_12, Lb_12 in FIG. 9, the threshold voltage distribution of the selected memory cell MCs after the fine writing is relatively low.

In this manner, according to the second embodiment, when the level of the write data (second data) to the adjacent memory cell MC is higher than that of the write data to the selected memory cell MCs, the controller 5 reduces the verify level from the first verify level to the second verify level, and sets the threshold voltage of the selected memory cell MCs to be lower in advance. For example, the threshold voltage of the selected memory cell MCs is put in the threshold range shown by the bold lines La_12, Lb_12 in FIG. 9. Accordingly, when the fine writing of the adjacent memory cell MC is performed, the threshold voltage of the selected memory cell MCs rises due to an inter-cell interference effect, and is shifted to the threshold range shown by the thin lines La_11 to Lb_11 from the threshold range shown by the bold lines La_12, Lb_12. That is, the threshold voltage of the selected memory cell MCs rises due to an inter-cell interference effect, but the rise is canceled out to some extent. In this manner, even when being subject to an inter-cell interference effect, the threshold voltage of the selected memory cell MCs may be put in a desired threshold range (range shown by the thin lines La_11, Lb_11).

On the other hand, if the level of the write data to the adjacent memory cell MC is equal to or less than that of the write data to the selected memory cell MCs, the writing of the selected memory cell MCs is performed as usual, so as to achieve the desired threshold voltage distribution (thin line La_11, Lb_11 in FIG. 9). Accordingly, when the inter-cell interference effect is relatively small, the threshold voltage of the selected memory cell MCs can be put in a desired threshold range from the beginning. In this case, even when the fine writing of data to the adjacent memory cell MC is performed, the threshold voltage of the selected memory cell MCs is not significantly changed, therefore, the threshold voltage of the selected memory cell MCs maintains the desired threshold voltage distribution. Note that the operational flowchart of the memory according to the second embodiment may be the same as the flow diagram of FIG. 7.

In this manner, according to the second embodiment, even when the inter-cell interference effect is relatively large, or even when it is relatively small, the threshold voltage of the selected memory cell MCs may be put in a desired threshold range, thus, it is possible to attain a desired threshold voltage distribution (thin lines La_11 to Lc_11 in FIG. 9) of the selected memory cell MCs. As a result, the memory according to the second embodiment can achieve the same effects as in the first embodiment.

In the second embodiment, when the write data to the adjacent memory cell MC is data which is logically two or more levels higher than the write data to the selected memory cell MCs, the controller 5 may reduce the verify level of the selected memory cell MCs. For example, when the write data to the selected memory cell MCs is at the A level, and the write data to two adjacent memory cells MC of both sides thereof is at the C level, the controller 5 may reduce the verify level for the selected memory cell MCs.

Further, when the write data to the adjacent memory cell MC is data which is logically one level higher than the write data to the selected memory cell MCs, the controller 5 may reduce the verify level of the selected memory cell MCs. For example, when the write data to the selected memory cell MCs is at the A level, and the write data to two adjacent memory cells MC of both sides thereof is at the B level, the controller 5 may reduce the verify level for the selected memory cell MCs.

Furthermore, based on the write data to one adjacent memory cell MC on one side, the controller 5 may reduce the verify level for the selected memory cell MCs. In this case, for example, the second verify level of the selected memory cell MCs may be at an intermediate level between the second verify level and the first verify level, which is set based on the write data to the adjacent memory cells MC of both sides thereof.

Thus, in the second embodiment, the controller 5 changes the verify level, based on the combination of the write data to the selected memory cell MCs and the write data to the adjacent memory cell MC. Thus, it is possible to further narrow the threshold voltage distribution of a memory cell MC while considering an inter-cell interference effect.

As described above, in the same page, writing of data at a lower level is completed earlier, and it takes longer time to complete writing data at higher level. Therefore, if the threshold voltage of the write data to the adjacent memory cell is higher than that of the write data to the selected memory cell MCs, the selected memory cell MCs is susceptible to an inter-cell interference effect. Therefore, even in this case, according to the second embodiment, even when being subject to an inter-cell interference effect, the threshold voltage distribution of the selected memory cell MCs may be close to a desired distribution.

The second embodiment is applicable to QPW as in the first embodiment. That is, the second embodiment may be combined with the above variation. Thus, the second embodiment can also achieve the effect of the variation. In this case, the operational flowchart of the memory may be the same as the flow diagram of FIG. 8.

Further, the above-described embodiment may be applicable to not only a two-dimensional structure memory in which memory cells are arranged in a plane, but also a three-dimensional structure (stacked type) memory in which memory cells are arranged three-dimensionally.

While certain embodiments have been described, these embodiments have been presented byway of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a plurality of word lines;
   a plurality of bit lines;
   a plurality of memory cells at intersections of the word lines and the bit lines;
   a word line driver configured to apply a voltage to a selected word line among the plurality of word lines;
   a sense amplifier circuit configured to detect the data of at least one of the memory cells; and
   a controller configured to control the word line driver and the sense amplifier,
   wherein a write sequence for writing first data to a selected memory cell connected to the selected word line includes a write loop that includes a write operation in which a write voltage is applied to the selected word line by the word line driver, and a verify operation during which, when a threshold voltage of the selected memory cell reaches a reference voltage, writing to the selected memory cell is completed by the controller,
   based on second data to be written to a memory cell adjacent to the selected memory cell at a time later than the first data, the controller changes the reference voltage used for the verify operation of the selected memory cell, and
   the adjacent memory cell is connected to a word line adjacent to the selected word line.

2. The semiconductor memory device according to claim 1, wherein
   the controller selectively reduces the reference voltage used for completing writing to the selected memory cell based on the second data.

3. The semiconductor memory device of claim 2, wherein the adjacent word line is the next or previous word line to intersect the bit line connected to the selected memory cell.

4. The semiconductor memory device according to claim 1, wherein
   the data to be written to a memory cell is writable at a plurality of data states and an erase state, and when the second data is data that is logically only one level higher than the erase state, the controller changes the reference voltage used for completing writing to the selected memory cell.

5. The semiconductor memory device according to claim 1, wherein
the word line driver is configured to raise the voltage of the selected word line each time the write loop is performed in one write sequence,
in the write sequence of the first data, when the second data is data other than predetermined data and the threshold voltage of the selected memory cell exceeds a second reference voltage that is less than a first reference voltage, in the next write loop the controller raises voltage of the bit line connected to the selected memory cell in which the threshold voltage exceeds the second reference voltage, and completes a write sequence to the selected memory cell when the threshold voltage of the selected memory cell exceeds the first reference voltage, and
in the write sequence of the first data, when the second data is the predetermined data and the threshold voltage of the selected memory cell exceeds the second reference voltage, a write sequence to the selected memory cell is completed.

6. The semiconductor memory device according to claim 1, further comprising:
a buffer storage unit configured to store data to be later stored in a plurality of the memory cells connected to the selected word line and the adjacent word line.

7. The semiconductor memory device according to claim 6, wherein
the word line driver is configured to raise the voltage of the selected word line each time the write loop is performed in one write sequence,
in the write sequence of the first data, when the second data is data other than predetermined data and the threshold voltage of the selected memory cell exceeds a second reference voltage that is less than a first reference voltage, in the next write loop the controller raises the voltage of the bit line connected to the selected memory cell in which the threshold voltage exceeds the second reference voltage, and completes a write sequence to the selected memory cell when the threshold voltage of the selected memory cell exceeds the first reference voltage, and
in the write sequence of the first data, when the second data is the predetermined data and the threshold voltage of the selected memory cell exceeds the second reference voltage, a write sequence to the selected memory cell is completed.

8. A semiconductor memory device, comprising:
a plurality of word lines;
a plurality of bit lines;
a plurality of memory cells at intersections of the word lines and the bit lines;
a word line driver configured to apply a voltage to a selected word line among the plurality of word lines;
a sense amplifier circuit configured to detect the data of at least one of the memory cells; and
a controller configured to control the word line driver and the sense amplifier, wherein
a write sequence for writing first data to a selected memory cell connected to the selected word line includes a write loop that includes a write operation in which a write voltage is applied to the selected word line by the word line driver, and a verify operation during which, when a threshold voltage of the selected memory cell reaches a reference voltage, writing to the selected memory cell is completed by the controller,
based on second data to be written to a memory cell adjacent to the selected memory cell at a time later than the first data, the controller changes the reference voltage used for the verify operation of the selected memory cell,
the adjacent memory cell is connected to an adjacent bit line adjacent to at least one side of a selected bit line connected to the selected memory cell, and
the controller is configured to reduce the reference voltage used in the verify operation of the selected memory cell based on the second data.

9. The semiconductor memory device according to claim 8, wherein
when the threshold voltage of the second data is higher than the threshold voltage of the first data, the controller reduces the reference voltage used in a verify operation of the selected memory cell.

10. The semiconductor memory device according to claim 8, wherein
when the second data is data at logically two or more levels higher than the first data, the controller reduces the reference voltage used in a verify operation of the selected memory cell.

11. The semiconductor memory device according to claim 8, wherein
the adjacent memory cell is one of the memory cells on either side of the selected memory cell along the selected word line, and
when the second data in the adjacent memory cells is data at logically two or more levels higher than the first data, the controller reduces the reference voltage used in a verify operation of the selected memory cell.

12. The semiconductor memory device of claim 11, wherein the adjacent bit line is the next or previous bit line to intersect the word line along the selected bit line.

13. The semiconductor memory device according to claim 8, wherein
the word line driver is configured to raise the voltage of the selected word line each time the write loop is performed in one write sequence,
in the write sequence of the first data, when the second data is data other than predetermined data and the threshold voltage of the selected memory cell exceeds a second reference voltage that is less than a first reference voltage, in the next write loop the controller raises the voltage of the bit line connected to the selected memory cell in which the threshold voltage exceeds the second reference voltage, and completes a write sequence to the selected memory cell when the threshold voltage of the selected memory cell exceeds the first reference voltage, and
in the write sequence of the first data, when the second data is the predetermined data and the threshold voltage of the selected memory cell exceeds the second reference voltage, a write sequence to the selected memory cell is completed.

14. A semiconductor memory device, comprising:
a plurality of word lines;
a plurality of bit lines;
a plurality of memory cells at intersections of the word lines and the bit lines;
a word line driver configured to apply a voltage to a selected word line among the plurality of word lines;
a sense amplifier circuit configured to detect the data of at least one of the memory cells; and a controller configured to control the voltage applied to a memory cell by the word line driver in a plurality of steps, wherein each step has a greater voltage level than a prior step, and to control the voltage sensed in a memory cell by the sense amplifier, wherein a write sequence for writing first data to a selected memory cell connected to the selected word line includes a write loop that includes a write operation in which a write voltage is applied to the selected word line by the word line driver, and a verify operation in which, when a threshold voltage of the selected memory cell reaches a reference voltage, writing to the selected memory cell is completed by the controller, and the controller is configured to modify the final voltage applied by the driver to a first memory cell located at an intersection of a word line and a bit line based upon the highest voltage to be later applied to a second memory cell at an adjacent intersection of a word line and a bit line.

15. The semiconductor memory device of claim 14, wherein the controller is configured to modify the final voltage applied by the driver to a first memory cell located at an intersection of a word line and a bit line by reducing the reference voltage used in the verify operation of the first memory cell when the data to be later written in any of a plurality of adjacent memory cells is data having a voltage of at least two or more levels higher than the first data.

16. The semiconductor memory device of claim 15, wherein the controller is configured to write data to each memory cell in a sequence of lower middle writing, foggy writing and fine writing, wherein the data is written by lower middle writing to a first memory cell, thereafter data is written to the first memory cell using foggy writing, and thereafter data is written to an adjacent memory cell using lower middle writing.

* * * * *